(12) United States Patent
Kuwabara et al.

(10) Patent No.: US 7,238,967 B2
(45) Date of Patent: Jul. 3, 2007

(54) LIGHT EMITTING DIODE

(75) Inventors: Yasuki Kuwabara, Fujiyoshida (JP); Toshiyuki Wakatsuki, Kamikuishiki-mura (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/952,162

(22) Filed: Sep. 29, 2004

(65) Prior Publication Data

US 2005/0067628 A1 Mar. 31, 2005

(30) Foreign Application Priority Data

Sep. 30, 2003 (JP) .............................. 2003-340988

(51) Int. Cl.
*H01L 33/00* (2006.01)

(52) U.S. Cl. ................... 257/98; 257/99; 257/E33.072; 257/E23.067

(58) Field of Classification Search .................. 257/98, 257/99, 100, E33.072, E33.068, E33.067, 257/E33.058, 81, 79; 438/26, 27; 362/296, 362/310

See application file for complete search history.

(56) References Cited

U.S. PATENT DOCUMENTS

| 4,935,665 | A  | * | 6/1990  | Murata       | 313/500 |
| 6,355,946 | B1 | * | 3/2002  | Ishinaga     | 257/98  |
| 2003/0219919 | A1 | * | 11/2003 | Wang et al. | 438/26  |

* cited by examiner

*Primary Examiner*—Matthew C. Landau
(74) *Attorney, Agent, or Firm*—Browdy And Neimark, PLLC (57) ABSTRACT

A light emitting diode comprising: a base substrate having a pair of electrodes; a reflection cup installed on the base substrate; a light emitting element arranged at a bottom of the reflection cup; and a resin sealant enclosing the light emitting element; wherein the light emitting element is electrically connected to the electrodes through an opening formed in the bottom of the reflection cup; wherein the reflection cup comprises a film body held in a cup shape and a metal film formed on a surface of the film body. This construction makes the control of light directivity easy and can produce light with a narrow directivity.

12 Claims, 6 Drawing Sheets

LIGHT EMITTING DIODE

CROSS REFERENCE TO RELATED APPLICATION

The application claims the priority benefit of Japanese Patent Application No. 2003-340988, filed on Sep. 30, 2003, the entire description of which is incorporated herein by reference.

BACKGROUND OF THE INVENTION

1. Field of the Invention

The present invention relates to a light emitting diode used for illuminating a variety of electronic devices and also in recent years for illuminating Panel meters of automobiles, and in particular, relates to a light emitting diode provided with a reflection cup to give an illuminating light a desired directivity.

2. Description of Related Art

Figure 1:
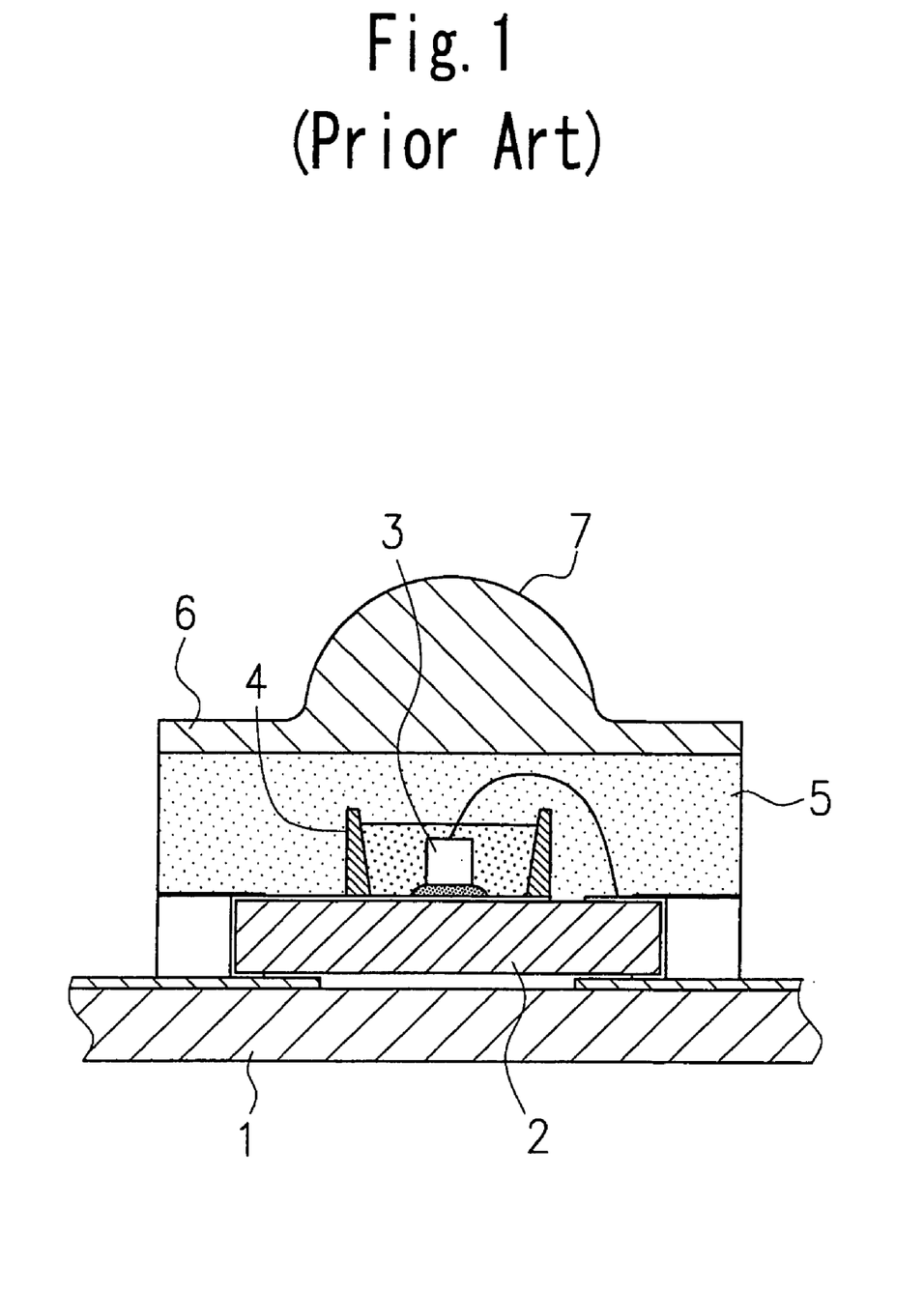
FIG. 1 is a cross-sectional view of an example of a conventional light emitting diode.

An example of light emitting diode of this kind is disclosed in Japanese Patent Disclosure No. 2002-324917. This light emitting diode, as shown in FIG. 1, comprises a base substrate 2 surface-mounted on a mother board 1, a light emitting element 3 put on an upper surface of the base substrate 2, a reflection cup 4 arranged to surround the light emitting element 3, a resin sealant 5 sealing the light emitting element 3 and the reflection cup 4, and a dome-shaped light collecting member 6 placed on the resin sealant 5.

In such a light emitting diode, light emitted from the light emitting element 3 is reflected by an inner circumferential surface of the reflection cup 4 to be given an upward directivity and then passes through a lens portion 7 of the light collecting member 6 to have a stronger directivity.

In recent years, there is a growing demand for a light emitting diode with a so-called narrow directivity, which focuses light emitted from a light emitting element and illuminates the focused light on a point. To realize such a narrow directivity using only a reflection cup requires a roughness height rating of the reflection cup surface to be less than or equal to one-half the wavelength $\lambda$ of light emitted from the light emitting element in order to control the light directivity.

Roughness height rating is defined as a measure of the surface finish or the arithmetical average from a true flat surface.

However, with the conventional light emitting diode described above, since many of the reflection cups are resin-molded products, there is a limitation on the roughness height rating of their cup surfaces. Even if the surface of the reflection cup is deposited or plated with a metal film, the surface roughness height rating which is less than or equal to one-half the wavelength $\lambda$ of light emitted from the light emitting element, required for the control of light directivity is difficult to achieve. Thus, the conventional reflection cup produces scattered rays of light, making it impossible to realize a desired narrow directivity with only the conventional reflection cup. It has been therefore necessary to provide an additional member such as the light collecting member 6, rendering the device that much costly. Other problems of the conventional device include a nonuniform color of emitted light due to chromatic aberration and an increased size of the light emitting diode.

SUMMARY OF THE INVENTION

An object of the present invention is to provide a light emitting diode capable of producing light with a narrow directivity by improving functions of a reflection cup without using an additional member, such as a light collection member, as related art does.

To achieve the above objective, the light emitting diode of this invention comprises: a base substrate having a pair of electrodes disposed thereon; a reflection cup installed on the base substrate; a light emitting element arranged to be disposed at a bottom of the reflection cup; and a resin sealant enclosing the light emitting element; wherein the light emitting element is electrically connected to the pair of the electrodes through an opening formed in the bottom of the reflection cup; wherein the reflection cup comprises a film body held in a cup shape and a metal film formed on a surface of the film body.

The base substrate of this invention may use a glass epoxy substrate or flexible circuit substrate formed with an electrode pattern thereon. To produce light with a narrow directivity, it is desired that the reflection cup be formed in an almost hemispherical cup shape with a deep bottom.

The film body of this invention may be formed from, for example, a polyimide film by press forming. The polyimide film has advantages such as a very fine surface roughness height rating and a high heat resistance. The shape of the formed film body depends on the shapes of the male and female molds used for press forming.

In one example of this invention, the film body has its surface deposited with aluminum or silver, which has a high reflection effect. This metal deposition is generally done by evaporation. The surface roughness height rating of the deposited metal film is less than or equal to one-half the wavelength $\lambda$ of light emitted from the light emitting element. With the surface roughness kept at less than or equal to one-half the wavelength $\lambda$, the diffusion of the reflected light can be decreased or minimized, easily producing light with a narrow directivity.

In another example of this invention, the light emitting element is flip-chip mounted on the electrodes of the base substrate through bumps such as solder bumps, gold bumps, and soon. This mounting method enables a size reduction of the reflection cup, which in turn leads to a narrow directivity. The opening formed in the bottom of the reflection cup through which the bumps are connected to the electrodes of the base substrate need only be large enough to accommodate the bumps. This makes it possible to secure a wide reflection surface below the light emitting element (bottom surface of the reflection cup), contributing to a more efficient extraction of upwardly reflected light.

In still another example of this invention, a frame to support the reflection cup may be arranged on the back side of the reflection cup. Supporting the reflection cup with the frame facilitates the handling of the light emitting diode. Further, by providing spaces in the frame on the back side of the reflection cup and installing electronic components in these spaces, a further reduction in size can be realized. The electronic components include, for example, Zener diode, capacitor and resistor, all used to prevent an accumulation of electrostatic charges in the light emitting diode.

With this invention the use of a film with a fine surface roughness height rating as the reflection cup of the light emitting diode renders the control of light directivity easy, thus making it possible to produce light with a narrow directivity using a simple construction without an additional light collecting member.

DETAILED DESCRIPTION OF THE PREFERRED EMBODIMENT

Figure 2:
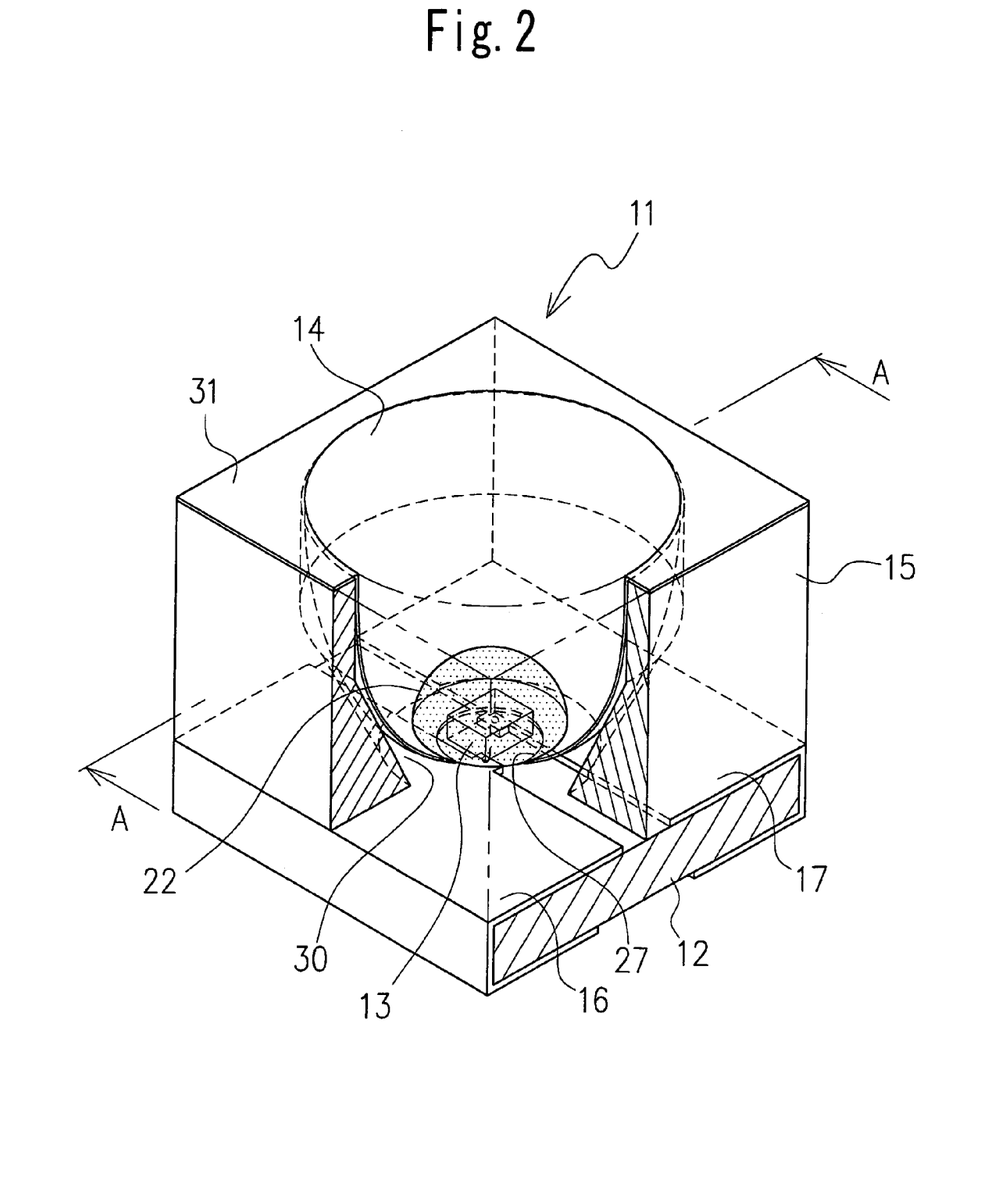
FIG. 2 is a perspective view showing one embodiment of a light emitting diode according to the present invention.
Figure 3:
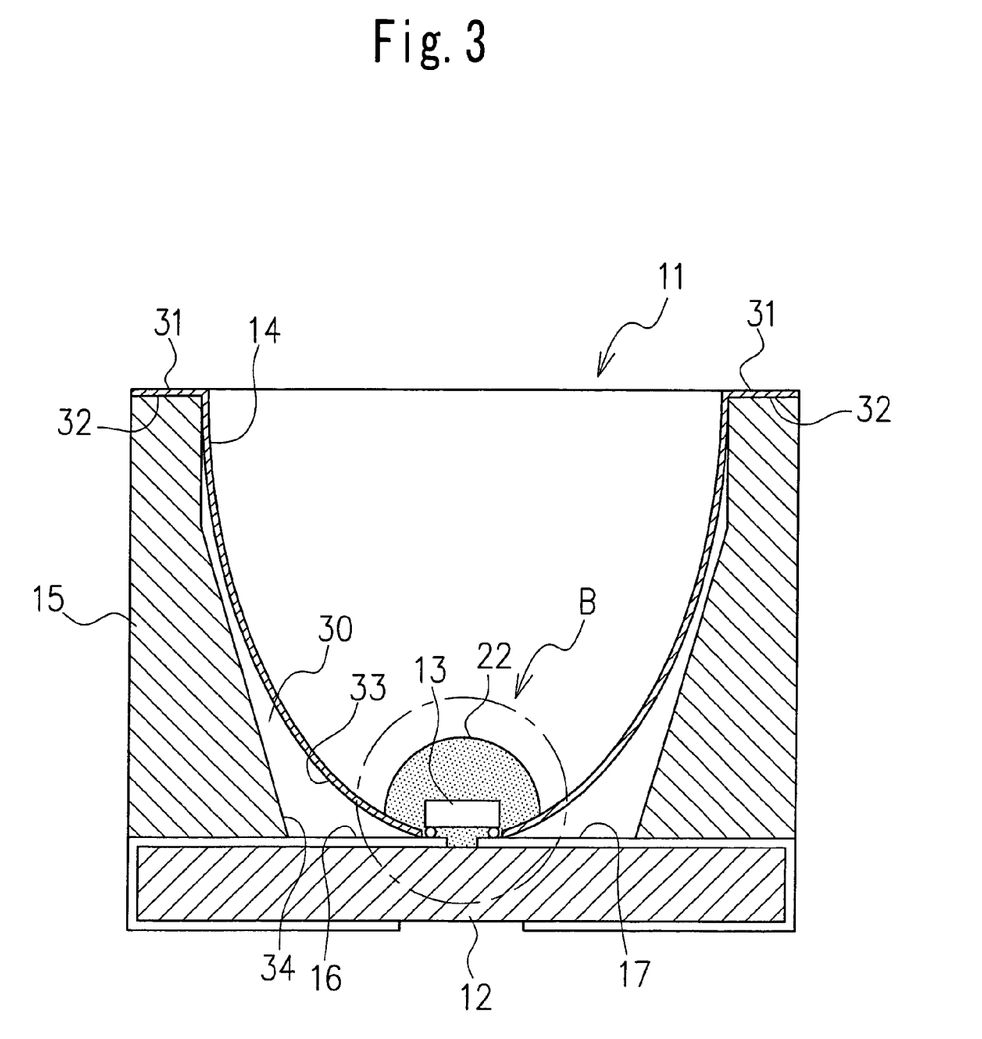
FIG. 3 is a cross-sectional view of the light emitting diode taken along the line A—A of FIG. 2.
Figure 4:
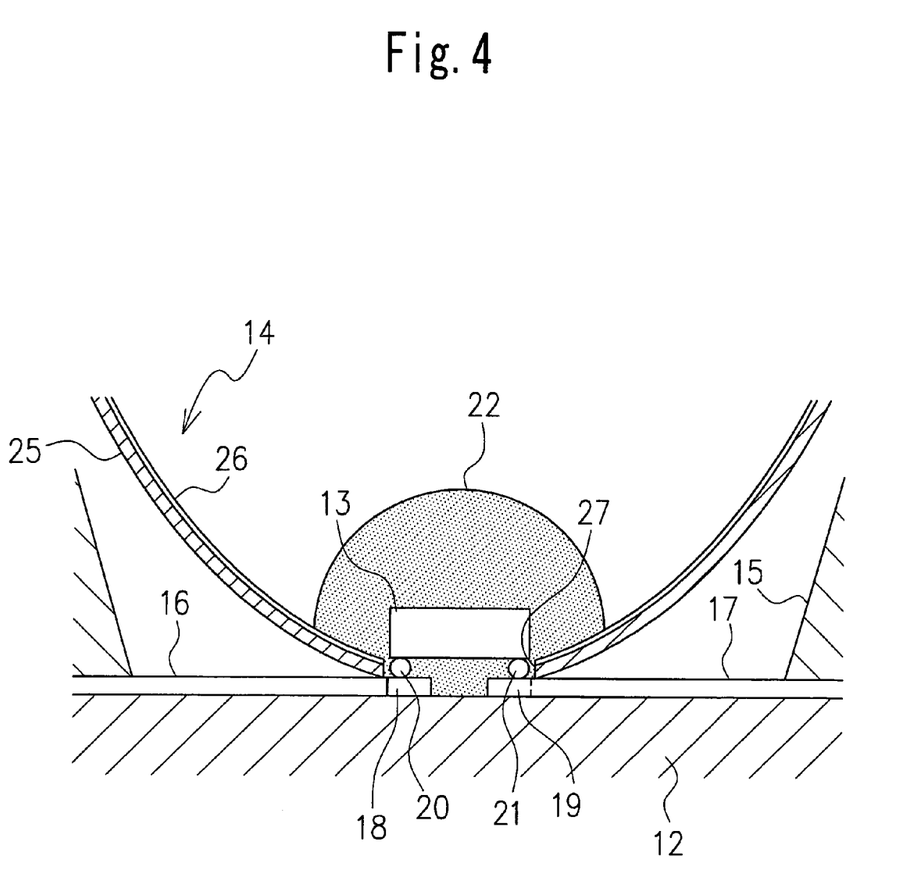
FIG. 4 is an enlarged view of a part B of the light emitting diode of FIG. 3.

Now, embodiments of the light emitting diode of this invention will be described in detail by referring to the accompanying drawings. FIG. 2 is a perspective view showing an entire construction of the light emitting diode as one embodiment of this invention. FIG. 3 is a cross-sectional view taken along the line A—A of FIG. 2. FIG. 4 is an enlarged view of a part B of FIG. 3.

As shown in FIG. 2 to FIG. 4, a light emitting diode 11 of this invention has an almost square base substrate 12 having a pair of electrodes formed on a surface of a glass epoxy substrate, a light emitting element 13 arranged at an almost central part of an upper surface of the base substrate 12, a reflection cup 14 arranged to surround the light emitting element 13 to control a directivity of light emitted from the light emitting element 13, and a frame 15 arranged on a back side of the reflection cup 14 to support it.

The paired electrodes formed on the base substrate 12 are made up of a cathode 16 and an anode 17 separated from each other at nearly the central part of the base substrate 12. At the central part of the base substrate 12 where the cathode 16 and the anode 17 face each other, these electrodes are formed with protrusions 18, 19 on which the light emitting element 13 is mounted. The cathode 16 and the anode 17 also are folded to the back side of the base substrate 12 for electric connection to the mother board (not shown).

The light emitting element 13 of this embodiment is available for a variety of colors of light and there is no limitation on the selection of color. A pair of bumps 20, 21 such as solder bumps, gold bumps, and so on provided under the light emitting element 13 ensures an electric conduction of the light emitting element 13 to the cathode 16 and the anode 17. More specifically, the paired bumps 20, 21 are secured to the protrusions 18, 19 of the cathode 16 and the anode 17. A flip-chip mounting using the bumps 20, 21 has contributed to reducing a size of the reflection cup 14, providing a construction with a narrow directivity, the feature of this invention. Rather than using the bumps 20, 21, a conduction means using bonding wires can of course be employed.

The reflection cup 14 arranged to surround the light emitting element 13 comprises a film body 25 held in a cup shape and a metal film 26 coated over the surface of the film body 25. In this embodiment, the film body 25 is made by forming a polyimide film about 25 μm thick in a cup shape.

An example process of-forming the film body 25 involves holding a polyimide film between heated male and female molds and press-forming it. The polyimide film has a very small roughness height rating on its surface and a high heat resistance of about 400° C. and thus can well withstand a heating temperature of 250–300° C. in a reflow furnace. Films other than polyimide film can be used and so-called a flexible substrate formed with conductive circuit patterns on the film can also be used.

The degree of narrowness of the light directivity depends on the shape of cup of the formed film body 25. To secure a narrow directivity, the object of this invention, it is desired that an almost hemispherical cup shape with a deep bottom, i.e., a paraboloidal shape such as shown in FIG. 2 and FIG. 3, be used. By putting the light emitting element 13 at a focus of this paraboloid the rays of light emitted from the light emitting element 13 can be turned into upward parallel rays upon being reflected by the inner circumferential surface of the reflection cup 14. The depth and size of the nearly paraboloidal reflection cup 14 with the light emitting element located at its focus are determined by how much one wishes to narrow the angle of directivity of light from the light emitting element.

The inner circumferential surface of the cup-shaped film body 25 is coated with the metal film 26 by vapor deposition. Metals chosen for the metal film 26 include aluminum and silver that will easily form a mirror surface with a high reflectivity. Since the metal film 26 is formed by evaporation over the surface of the film body 25 which itself has a small surface roughness height rating, the metal film 26 can easily have a surface roughness height rating less than or equal to one-half the wavelength λ of light from the light emitting element. Thus the light reflected by the metal film 26 can be prevented from being scattered, making the control of light for narrow directivity easier.

In this embodiment, the reflection cup 14 has at its bottom a circular opening 27 of a size that matches that of the light emitting element 13. The light emitting element 13 is disposed above the opening 27 so that the bumps 20, 21 of the light emitting element 13 are connected respectively to the protrusions 18, 19.of the cathode and anode 16, 17 exposed through the opening 27.

Figure 5:
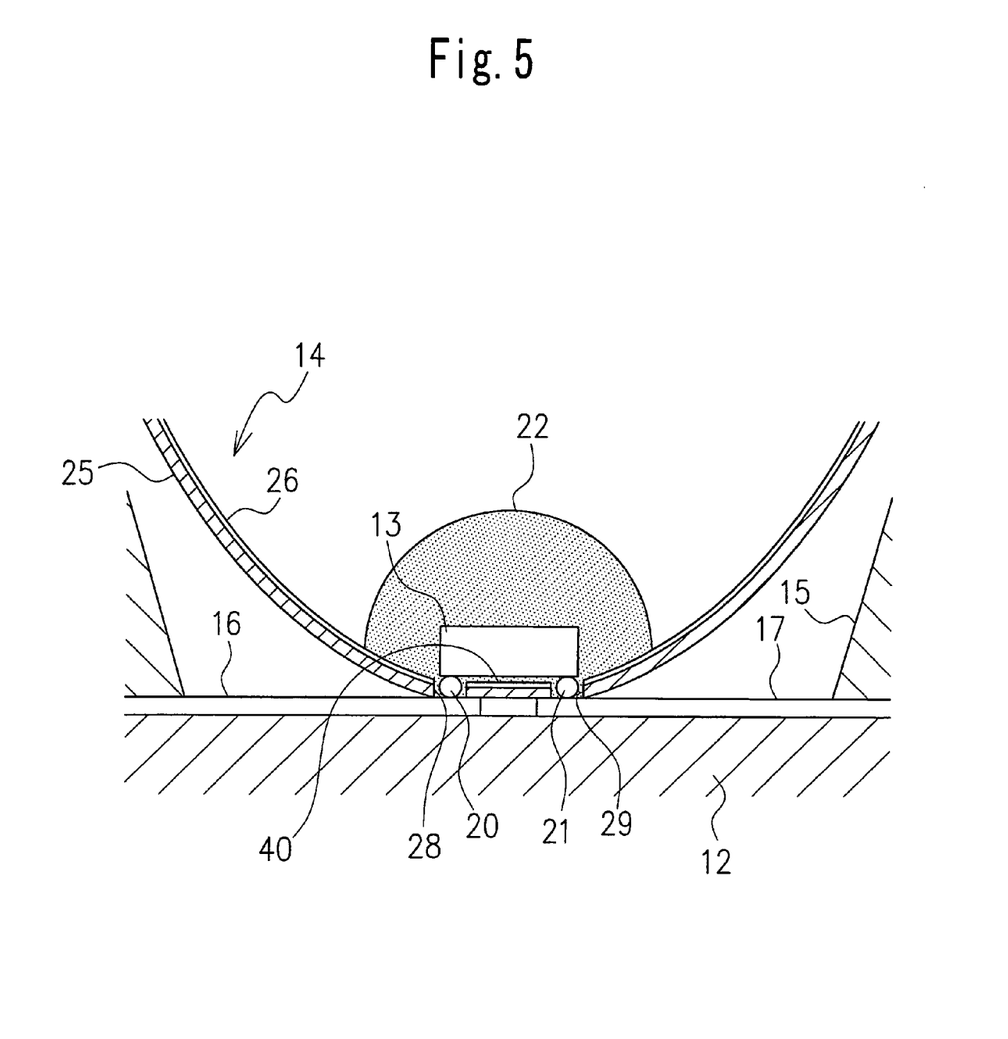
FIG. 5 is an enlarged view of another embodiment similar to FIG. 4.

FIG. 5 shows another example of the opening formed in the bottom of the reflection cup 14. In this example, only small openings 28, 29 matching in size the pair of bumps 20, 21 of the light emitting element 13 are formed in the bottom of the reflection cup 14. This construction can secure a wide reflection surface 40 beneath the light emitting element 13 (bottom surface of the reflection cup 14 formed with the metal film 26). So, a reflection loss of light emitted from the underside of the light emitting element 13 is reduced, contributing to a more efficient extraction of upwardly reflected light.

In either of the above embodiments, a resin sealant 22 in the reflection cup 14 covers only an upper part of the light emitting element 13. Installed in the reflection cup 14, the resin sealant 22 does not affect the overall geometry of the light emitting diode 11 and thus can keep the diode small in size. Further, the resin sealant 22 is formed convex like a lens. Thus, the light emitted from the light emitting element 13 is focused in the same direction as the directivity of the reflection cup 14, producing a reflected light with a strong narrow directivity. The resin sealant 22 is formed, for instance, of epoxy resin with a light transmission capability.

In this embodiment, a frame 15 to support the reflection cup 14 is arranged on the back side of the reflection cup 14. The reflection cup 14, though formed of a thin film, holds itself in the shape of cup. Considering the ease of handling, however, the reflection cup 14 is supported by the frame 15. The frame 15 is a block of molded resin almost equal in size to an external dimension of the base substrate 12 and has a large recess 30 at a central part of the upper surface thereof to accommodate the reflection cup 14. The recess 30 pierces vertically through the frame 15 and progressively tapers off from the top toward the bottom to conform to the paraboloidal surface of the reflection cup 14. The opening of the recess 30 on the upper surface of the frame almost conforms in shape to the upper end of the reflection cup 14 and the depth of the recess 30 almost matches the height of the reflection cup 14. In this embodiment, the reflection cup 14 has an outwardly extending flange 31 along the entire circumference thereof, which is placed on an opening edge 32 of the recess 30 on the upper surface to support the reflection cup 14.

As shown in FIG. 2 and FIG. 3, while this embodiment has the reflection cup 14 supported by the frame 15 only through the outwardly extending flange 31, it is also possible to support a back surface 33 of the reflection cup 14 with an inner circumferential surface 34 of the recess 30.

In the light emitting diode 11 constructed as described above, the light emitted from the light emitting element 13 is given an upward directivity by the reflection cup 14 and since the scattering of light on the surface of the reflection cup 14 is prevented, the control of a preset directivity can be made easy. This in turn allows light with a narrow directivity to be produced easily by the above reflection cup 14 alone.

With the above light emitting diode 11, since there is no need to additionally provide a light collecting member having a lens portion, as in the conventional construction, to produce a narrowly directed light, the construction of the light emitting diode becomes simple and the manufacturing cost can be made that much lower. Further, nonuniform color of light due to chromatic aberration that occurs when the light passes through the lens portion of the light collecting member can be eliminated. This construction also enables a size reduction of the light emitting diode.

Figure 6:
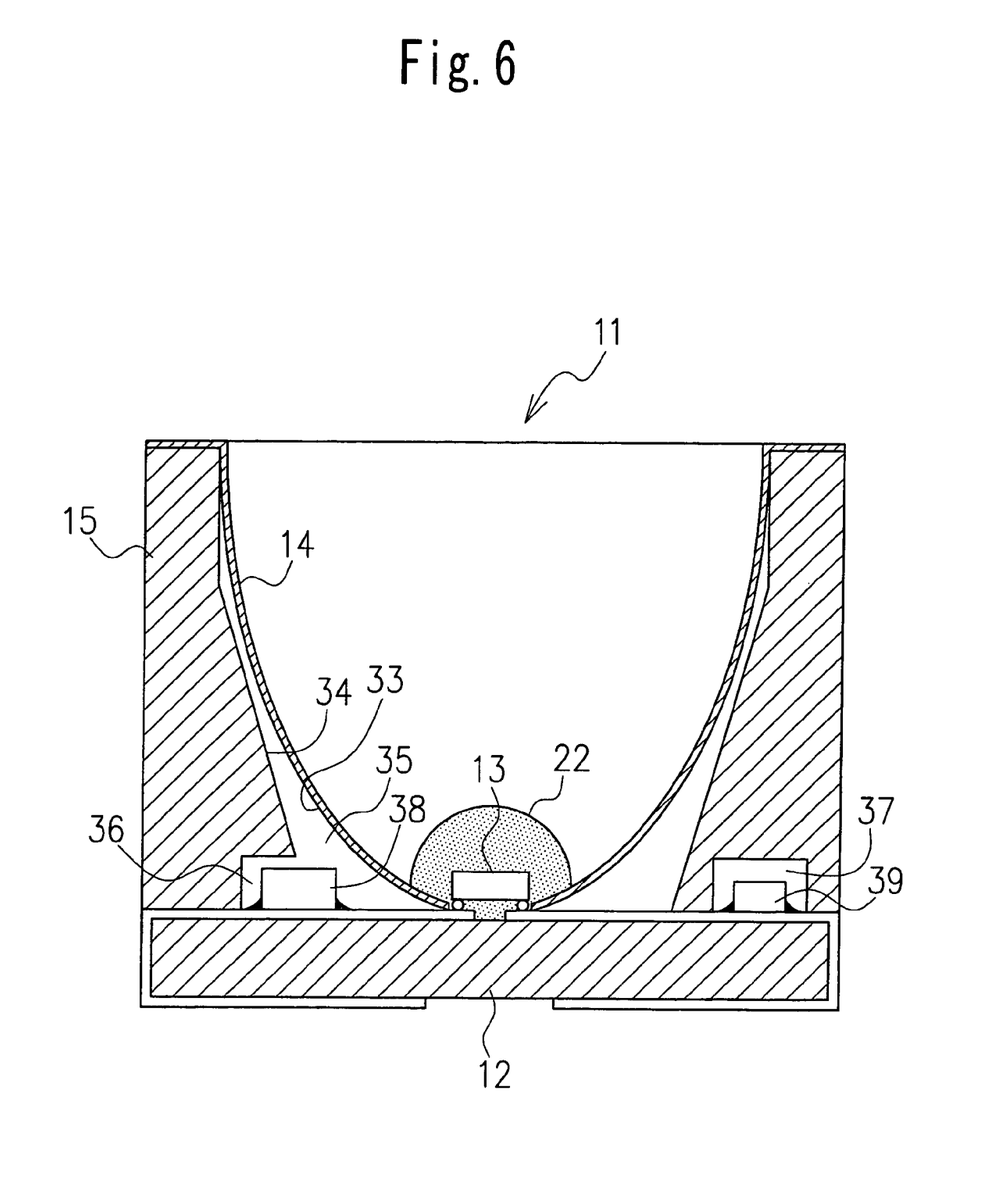
FIG. 6 is a cross-sectional view of the second embodiment similar to FIG. 3.

FIG. 6 shows another embodiment of the light emitting diode according to this invention, in which not only the light emitting element 13 but also other electronic components are mounted on the base substrate 12.

In this embodiment, a space 35 formed between the back surface 33 of the reflection cup 14 and the inner circumferential surface 34 of the recess 30 and spaces 36, 37 formed in the frame 15 are used to install a variety of electronic components 38, 39. One of the spaces, 36, communicates with the space 35 formed on the back of the reflection cup 14, so that a relatively large electronic component 38 can be installed there. Another space 37 is provided independently of the space 35. The electronic components 38, 39 include, for example, Zener diode, capacitor and resistor, all used to prevent an accumulation of electrostatic charges in the light emitting diode 11. The number and volume of the spaces 35, 36 and 37 are properly selected to cope with the size and number of the electronic components 38, 39 to be accommodated. These do not affect the geometry of the reflection cup 14.

By utilizing the space 35 formed between the reflection cup 14 and the frame 15 and the spaces 36, 37 in the frame 15 to accommodate the electronic components 38, 39, the demand for a size reduction of the light emitting diode 11 can-be met.

Although-in the above embodiments the reflection cup 14 has been described to be hollow inside and open, a cover may be provided at the upper surface of the reflection cup 14 to enclose its hollow interior. Further, the interior of the reflection cup 14 may also be filled with a sealing resin. In that case, the resin sealant 22 in the preceding embodiments that seals only the light emitting element 13 may be omitted.

What is claimed is:

1. A light emitting diode comprising:
    (a) a base substrate having a pair of electrodes;
    (b) a reflection cup disposed above the base substrate;
    (c) a light emitting element disposed on the base substrate at a bottom of the reflection cup; and
    (d) a resin sealant enclosing the light emitting element;
    (e) wherein the light emitting element is electrically connected to the electrodes through an opening formed in the bottom of the reflection cup;
    (f) wherein the reflection cup comprises a film body formed in a cup shape which is configured to be capable of independently retaining the cup shape, and a metal film formed on a surface of the film body;
    (g) wherein a frame configured to support an upper part of the reflection cup is disposed on the base substrate separated from an outer surface of the reflection cup.

2. A light emitting diode according to claim 1, wherein the reflection cup has an almost hemispherical cup shape with a deep bottom.

3. A light emitting diode according to claim 1, wherein the film body is a polyimide formed film.

4. A light emitting diode according to claim 1, wherein the metal film is a deposited film of silver or aluminum.

5. A light emitting diode according to claim 1 or 4, wherein the metal film has a surface roughness height rating which is less than or equal to half of a wavelength of light emitted from the light emitting element.

6. A light emitting diode according to claim 1, wherein the resin sealant is formed in a shape of a convex lens and encloses the light emitting element in the reflection cup.

7. A light emitting diode comprising:
    (a) a base substrate having a pair of electrodes;
    (b) a reflection cup disposed above the base substrate;
    (c) a light emitting element disposed on the base substrate at a bottom of the reflection cup; and
    (d) a resin sealant enclosing the light emitting element;
    (e) wherein the light emitting element is electrically connected to the electrodes through an opening formed in the bottom of the reflection cup;
    (f) wherein the reflection cup comprises a film body formed in a cup shape which is capable of independently retaining the cup shape and a metal film formed on a surface of the film body;
    (g) wherein the light emitting element is flip-chip mounted on the electrode portions on the base substrate through bumps and the opening formed in the bottom of the reflection cup has a size matching those of the bumps.

8. A light emitting diode comprising:
    (a) a base substrate having a pair of electrodes;
    (b) a reflection cup disposed above the base substrate;
    (c) a light emitting element disposed on the base substrate at the bottom of the reflection cup; and
    (d) a resin sealant enclosing the light emitting element;
    (e) wherein the light emitting element is electrically connected to the electrodes through an opening formed in the bottom of the reflection cup;
    (f) wherein the reflection cup comprises a film body in a cup shape which is configured to be capable of independently retaining the cup shape, and a metal film is formed on a surface of the film body;
    (g) wherein a frame configured to support the reflection cup is disposed on the base substrate separate from an outer surface of the reflection cup;
    (h) wherein a space is provided between the frame and the outer surface of the reflection cup.

9. A light emitting diode according to claim 8, wherein the reflection cup includes a flange to be supported by the frame.

10. A light emitting diode according to claim 8, wherein the electronic components include at least one of Zener diode, capacitor and resistor.

11. A light emitting diode comprising:
(a) a base substrate having a pair of electrodes;
(b) a reflection cup installed on the base substrate;
(c) a light emitting element arranged at a bottom of the reflection cup; and
(d) a resin sealant enclosing the light emitting element;
(e) wherein the light emitting element is electrically connected to the electrodes through an opening formed in the bottom of the reflection cup;
(f) wherein the reflection cup comprises a film body formed in a cup shape which is capable of independently retaining the cup shape, and a metal film formed on a surface of the film body;
(g) wherein a frame to support the reflection cup is arranged on a back side of the reflection cup; and
(h) wherein a space to install electronic components is provided between the frame and back side of the reflection cup.

12. A light emitting diode comprising:
(a) a base substrate having a pair of electrodes;
(b) a reflection cup disposed above the base substrate;
(c) a light emitting element disposed on the base substrate at a bottom of the reflection cup; and
(d) a resin sealant enclosing the light emitting element;
(e) wherein the light emitting element is electrically connected to the electrodes through an opening formed in the bottom of the reflection cup;
(f) wherein the reflection cup comprises a film body in a cup shape which is configured to be capable of independently retaining the cup shape, and a metal film formed on a surface of the film body;
(g) wherein a frame configured to support the reflection cup is disposed on the base substrate off from an outer surface of the cup shape; and
(h) wherein a space is provided between the frame and the reflection cup.

* * * * *